United States Patent [19]

Pouysegur et al.

[11] Patent Number: 5,136,193
[45] Date of Patent: Aug. 4, 1992

[54] LIMITER CIRCUIT HAVING A FIELD EFFECT TRANSISTOR

[75] Inventors: Michel Pouysegur; Thierry Parra; Michel Gayral; Jacques Graffeuil; Jean-Francois Sautereau, all of Toulouse, France

[73] Assignee: Alcatel Espace, Courbevoie, France

[21] Appl. No.: 668,657

[22] Filed: Mar. 13, 1991

[30] Foreign Application Priority Data

Mar. 15, 1990 [FR] France .................. 90 03335

[51] Int. Cl.$^5$ .................. H03G 11/04; H04B 3/04
[52] U.S. Cl. .................. 307/568; 307/264; 328/171; 328/172; 328/173; 333/17.2
[58] Field of Search .................. 307/567, 568, 264; 328/169-173; 333/17.2

[56] References Cited

U.S. PATENT DOCUMENTS 4,162,412 7/1979 Mawhinney et al. .............. 307/554
4,167,681 9/1979 Wolkstein et al. .................. 333/17.2

OTHER PUBLICATIONS

NEC Research and Development, vol. 48, No. 1, 1978, Tokyo, Japan, pp. 61-65; S. Fukuda et al.: "A New Microwave Amplitude Limiter Using GaAs Field Effect Transistors."

1985 IEEE-MTT-S International Microwave Symposium Digest, Jun. 4-6, 1985, New York, USA; pp. 613-616; B. R. Hallford: "30 dB of AGC from an FET".

Primary Examiner—Eugene R. LaRoche
Assistant Examiner—Michael B. Shingleton
Attorney, Agent, or Firm—Sughrue, Mion, Zinn, Macpeak & Seas

[57] ABSTRACT

A limiter circuit having a field effect transistor whose bias circuit is constituted by two constant voltage feeds: one for its gate and the other for its drain, with a resistive load being connected in series with the feed to the gate of the transistor. The invention is particularly applicable to space telecommunications.

5 Claims, 2 Drawing Sheets

LIMITER CIRCUIT HAVING A FIELD EFFECT TRANSISTOR

The invention relates to a limiter circuit having a field effect transistor.

BACKGROUND OF THE INVENTION

In some active microwave systems it is necessary to use limiter circuits having the function of delivering constant output power regardless of the power applied to the input. Such circuits are nowadays generally constituted by field effect transistors (FETs) used under saturation conditions beyond their compression points.

In addition, in certain specific applications it is appropriate for the phase of the signal delivered by the limiter circuit to remain constant in spite of variation in the input signal. However, experience shows that sometimes the use of certain types of field effect transistors makes it possible to satisfy this requirement whereas other types of field effect transistors are not suitable for overcoming phase variations that may be as much as several degrees.

The initial idea consists in making a limiter circuit using a field effect transistor that provides good performance with respect to variation in its insertion phase: i.e. the ratio of input signal phase to output signal phase of the limiter circuit as a function of the power injected to its input.

The major portion of the variation in insertion phase observed on limiter circuits using field effect transistors is due to the phase shift introduced by such transistors when they are used in their compression zone, i.e. in the zone for which their output power no longer varies for increasing input power.

An object of the invention is thus to provide a limiter circuit using a field effect transistor and enabling the insertion phase variation introduced by field effect transistors operating under saturated conditions to be minimized.

There is very little published work, at present, on this subject.

Only one article, by Serge Bertrand, entitled (in translation) "An FET amplifier-limiter without phase shift—application to the 7.9 GHz to 8.4 GHz band", and published at pages 146 and 147 of (in translation) "The National Microwave Symposium" held at Nice, France June 1987, which article describes the phase variations of a field effect transistor as a function of input power and of the impedance present at its output, demonstrates the feasibility of a limiter circuit based on a field effect transistor and having optimized phase shifting. The article also describes a module suitable for being cascaded and a limiter circuit having a phase shift of less than 2° over a dynamic range of 21 dB in the 8.1 GHz to 8.3 GHz band.

That article thus describes making a limiter circuit using an AsGa field effect transistor having excellent performance with respect to insertion phase variation (less than 2° for input power varying from $Pe = -\infty$ to $Pe = Pe_{1dB} + 10$ dBm). In order to achieve this result, that article does not describe a circuit technique per se, but a method of prior sorting transistors to select those transistors which have minimum insertion phase variation. Transistors selected in this way are then used to make the limiter circuit.

In contrast, the invention makes it possible, a priori, to limit insertion phase variation of the field effect transistors used to perform the limiting function, thereby making it possible to avoid this prior sorting technique.

SUMMARY OF THE INVENTION

To this end, the present invention provides a limiter circuit using a field effect transistor whose bias circuit is constituted by two constant voltage feeds: one for the gate and the other for the drain; a resistive load being disposed in series with the gate feed for said transistor, wherein said load is intended to keep the input capacitance of the transistor constant, thereby limiting the phase variations generated by the transistor, said load being constituted by a low resistance resistor such that $Rg \approx Ro \times 400/Z$, where Z is the width of the gate of the transistor expressed in micrometers and where Ro has a value of 20 Ω, Rg being expressed in ohms.

Thus, by virtue of the load, the reverse bias on the gate is increased while decreasing the input capacitance so as to compensate for the increase in capacitance caused by the gate being forward-biased. Variation in the insertion phase of the limiter circuit is thus reduced by 50%.

Advantageously, this simple technique is implemented using monolithic or hybrid circuit technology.

In an advantageous embodiment, the resistive load is constituted by a low value resistor such that $Rg \approx Ro \times 400/Z$ where Z is the width of the transistor gate expressed in micrometers and where Ro has a resistance of 20 Ω. More particularly, this load is less than 100 Ω.

When using AsGa type field effect transistors, this load lies in the range 10 Ω to 30 Ω.

BRIEF DESCRIPTION OF THE DRAWINGS

An embodiment of the invention is described by way of example with reference to the accompanying drawings, in which.

DETAILED DESCRIPTION OF THE PREFERRED EMBODIMENT

Figure 3:
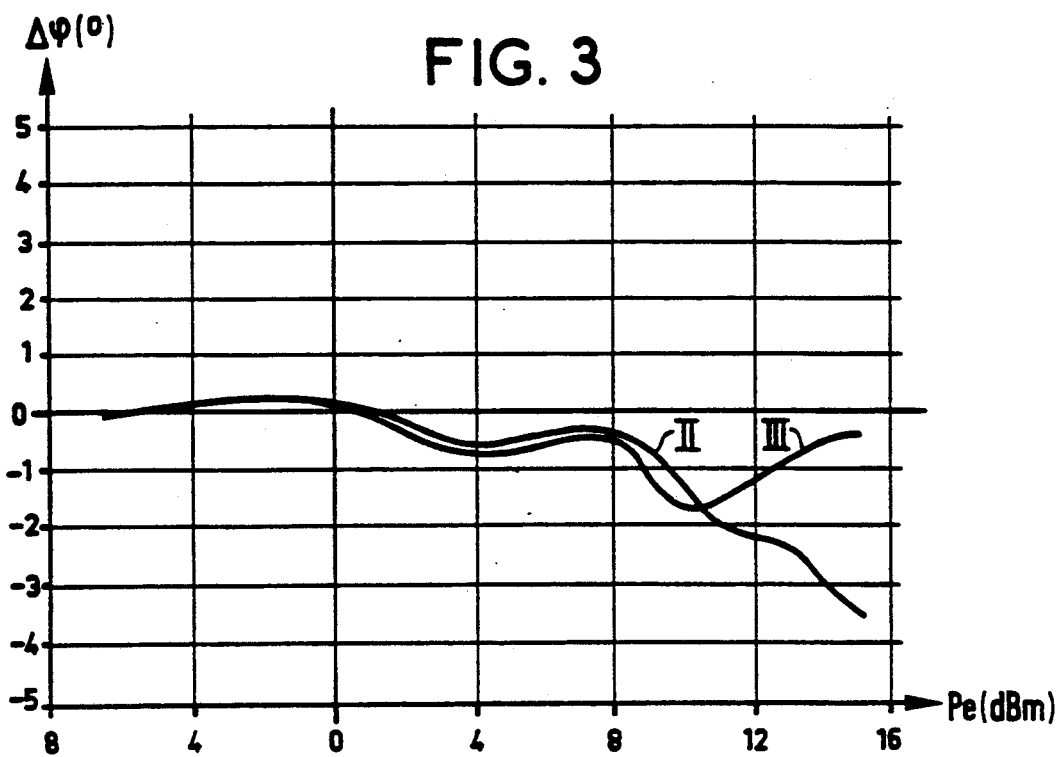

It is shown, both experimentally and theoretically, that input to output phase variation $\Delta\phi$ introduced by a field effect transistor under severe compression conditions, as shown in curve II of FIG. 3 as a function of input power Pe, is essentially due to variation in the input capacitance caused by the gate being forward-biased over a fraction of a cycle.

In general, the bias circuits used with field effect transistors, in particular for space applications, comprise a feedback circuit which maintains the drain current constant with a fixed drain voltage by acting on the gate voltage. However, such as system is to be avoided in limiter circuits since it worsens the effect described above. Gate capacitance is a direct function of the applied gate voltage.

In contrast, in the circuit of the invention, the bias circuit comprises two constant voltage feeds: Vgs to the gate and Vds to the drain. Given that an increase in reverse bias to the gate is accompanied by a reduction in its input capacitance, the circuit of the invention enables this reverse bias to be increased so as to compensate for the increase in capacitance caused by the gate being forward-biased. To achieve this function, the circuit of the invention includes a resistor Rg disposed in series in the gate bias circuit of the field effect transistor 10.

Figure 1:
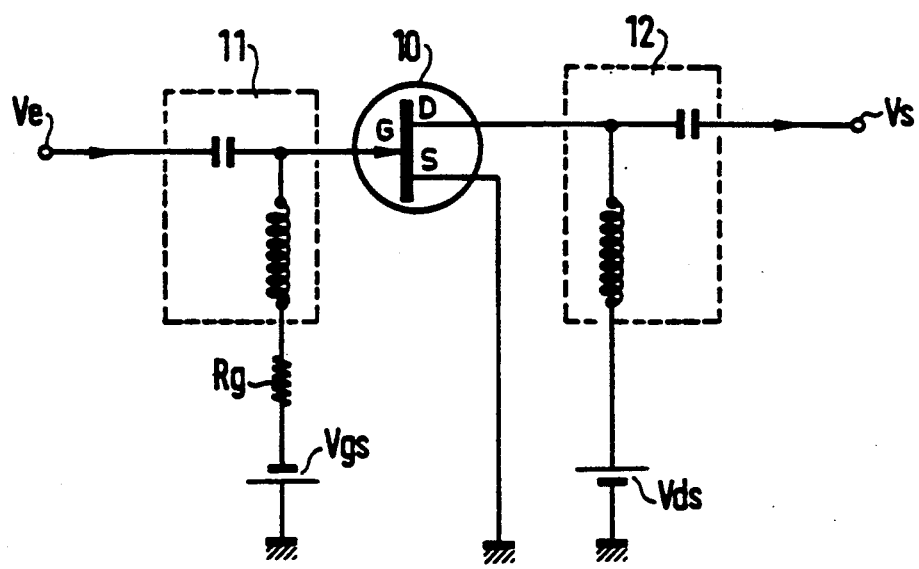
FIG. 1 shows a circuit of the invention.

The limiter circuit of the invention as shown in FIG. 1 thus comprises a field effect transistor 10, two feeds, one to the gate Vgs and one to the drain Vds, a resistor Rg connected in series with Vgs, and two bias T-shaped circuits 11 and 12 disposed on either side of the transistor 10 for the purpose of enabling the transistor 10 to be biased while not disturbing the outside circuit or propagation of the signal Ve, e.g. a microwave signal. Such bias T-shaped circuits are well known to persons skilled in the art for preventing the transistor 10 oscillating, and they conduct over a certain frequency range, e.g. very low frequencies.

As soon as a current appears on the gate, the voltage drop across the resistor Rg, taking account of the current flow direction, increases the reverse bias applied to the gate, thereby tending to maintain the input capacitance constant and consequently tending to limit phase variations produced by the transistor 10.

Figure 2:
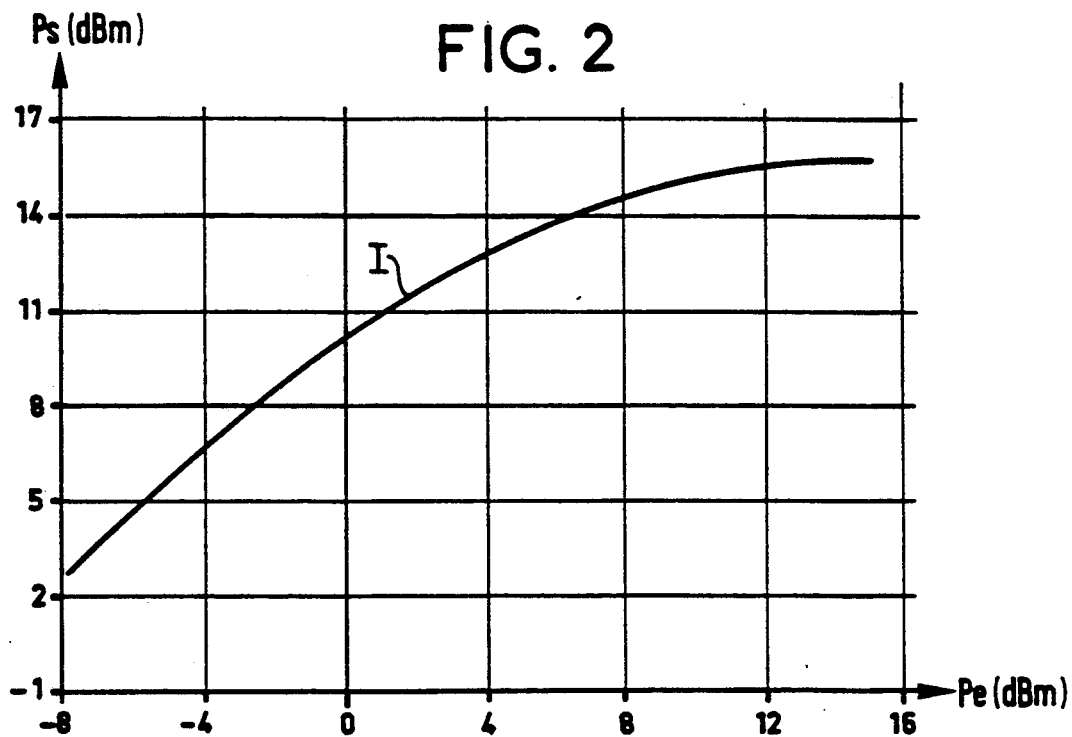
FIG. 2 and 3 are graphs for explaining the operation of the circuit of the invention.

Curve III in FIG. 3 shows input-output phase variation $\Delta\phi$ as generated by the field effect transistor 10 and as a function of input power Pe, and this curve shows that with Rg equal to 20 $\Omega$, the maximum phase variation is thus reduced from 3.5° to 2°. Note the power measurement is shown in dBm which refers to milliwatt in dB. It may also be observed that adding the resistor Rg has no effect on the power characteristic of the limiter circuit as shown by curve I in FIG. 2, which plots output power variation Ps as a function of input power Pe.

The resistance selected for Rg (generally a few ohms) is critical and depends on the characteristics of the transistor. It may be obtained wither by adjustment or else by prior non-linear simulation of the limiter circuit, providing that all of the electrical characteristics of the transistor have been determined if simulation is used.

Nevertheless, an approximate resistance for the resistor Rg can be determined using the following empirical formula:

$$Rg = Ro \times 400/Z$$

where Z is the width of the gate in the transistor used expressed in micrometers and where Ro has a value of 20 $\Omega$. Rg is then express in ohms.

It must be underlined that the resistance selected for the resistor Rg is very important: it determines whether or not the circuit of the invention operates properly. Numerous circuits including field effect transistors use a series resistor in the gate bias circuit, but this resistor generally has high resistance and is intended to protect the transistor against possible current overloading. However, such a resistor fails completely to have the looked-for effect with respect to minimizing insertion phase.

Typical resistances for the resistor Rg for obtaining proper operation of the circuit of the invention are less than 100 $\Omega$. More particularly, for an GaAs type field effect transistor, typical values lie in the range 10 $\Omega$ to 30 $\Omega$.

This limiter circuit of the invention advantageously has the following characteristics for measurements performed at about 10 GHz: for input power covering the range Pe = $-\infty$ to Pe = Pe$_{1dB}$ + 12 dBm, insertion phase variation is less than 2°. The resistance of the resistor Rg used being less than 100 ohms.

Naturally, the present invention has been described and shown merely by way of preferred example and its component parts could be replaced by equivalent parts without thereby going beyond the scope of the invention.

We claim:

1. A limiter circuit comprising a field effect transistor and a bias circuit for the field effect transistor, said bias circuit including two constant voltage feeds: one for the gate and the other for the drain; a resistive load being disposed in series with the gate feed for said transistor, wherein said resistive load is intended to keep the input capacitance of said transistor constant, thereby limiting the phase variations generated by said transistor, said resistive load being constituted by a low resistance resistor such that $Rg \approx Ro \times 400/Z$, where Z is the width of the gate of the transistor expressed in micrometers and where Ro has a value of 20 $\Omega$, Rg being expressed in ohms.

2. A circuit according to claim 1, wherein said bias circuit further comprises two bias T-shaped circuits.

3. A circuit according to claim 1, wherein said resistive load is less than 100 $\Omega$.

4. A circuit according to claim 1, wherein said transistor is of the GaAs type, and wherein said resistive load lies in the range of 10 $\Omega$ to 30 $\Omega$.

5. A microwave limiter circuit comprising a field effect transistor and a bias circuit for the field effect transistor, said bias circuit including two constant voltage feeds: one for the gate and the other for the drain; a resistive load being disposed in series with the gate feed for said transistor, wherein said resistive load is intended to keep the input capacitance of said transistor constant, thereby limiting the phase variations generated by said transistor, said resistive load being constituted by a low resistance resistor such that $Rg \approx Ro \times 400/Z$, where Z is the width of the gate of the transistor expressed in micrometers and where Ro has a value of 20 $\Omega$, Rg being expressed in ohms.

* * * * *